United States Patent
Xu et al.

(10) Patent No.: US 8,707,124 B2
(45) Date of Patent: Apr. 22, 2014

(54) METHOD FOR PROCESSING FORWARD ERROR CORRECTION, FEC, DATA, DEVICE AND SYSTEM THEREOF

(75) Inventors: Jin Xu, Shenzhen (CN); Xin Xu, Shenzhen (CN); Qiong Lei, Nanjing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 27 days.

(21) Appl. No.: 13/536,633

(22) Filed: Jun. 28, 2012

(65) Prior Publication Data

US 2012/0297266 A1 Nov. 22, 2012

Related U.S. Application Data

(63) Continuation of application No. PCT/CN2010/080340, filed on Dec. 28, 2010.

(30) Foreign Application Priority Data

Dec. 28, 2009 (CN) .......................... 2009 1 0243107

(51) Int. Cl.
*H03M 13/00* (2006.01)
*H04L 1/06* (2006.01)
*H03M 13/03* (2006.01)

(52) U.S. Cl.
CPC ............. *H04L 1/0618* (2013.01); *H03M 13/03* (2013.01)
USPC ....................................................... 714/752

(58) Field of Classification Search
CPC ............................. H04L 1/0618; H03M 13/03
USPC .............. 714/746, 748, 752, 776; 725/26, 44, 725/104
See application file for complete search history.

(56) References Cited

U.S. PATENT DOCUMENTS

| 8,037,397 | B2 * | 10/2011 | Luo et al. ....................... 714/799 |
| 8,301,982 | B2 * | 10/2012 | Ver Steeg et al. ............. 714/776 |
| 2005/0166123 | A1 | 7/2005 | Yanamoto et al. |

FOREIGN PATENT DOCUMENTS

| CN | 1497916 A | 5/2004 |
| CN | 1645783 A | 7/2005 |

OTHER PUBLICATIONS

Written Opinion of the International Searching Authority; dated (mailed) Apr. 7, 2011; issued in related Application No. PCT/CN2010/080340 for Huawei Tech Co., Ltd.

(Continued)

*Primary Examiner* — Shelly A Chase
(74) *Attorney, Agent, or Firm* — Conley Rose, P.C.; Grant Rodolph; Nicholas K. Beaulieu

(57) ABSTRACT

A method for processing Forward Error Correction, FEC, data, which includes: a sender encapsulates the FEC data to be a Transport Stream, TS, message, sets FEC identification information in the TS message, and encapsulates the TS message to be a Real-time Transport Protocol, RTP, message; then sends the RTP message to a terminal side. The reception end receives the RTP message; if the reception end has a function for FEC decoding, the reception end identifies the FEC data according to the FEC identification information in the TS message of the received RTP message, and recovers the missed media message according to the FEC data; if the reception end does not have the function for FEC decoding, the reception end processes the RTP message after removing the message header. The embodiments of the present invention also provide a transmission and processing device.

20 Claims, 6 Drawing Sheets

(56) References Cited

OTHER PUBLICATIONS

International Search Report; dated (mailed) Apr. 7, 2011; issued in related Application No. PCT/CN2010/080340 for Huawei Tech Co., Ltd.

Foreign Communication From A Counterpart Application, Chinese Application 200910243107.8, Chinese Office Action dated Dec. 19, 2012, 6 pages.
Foreign Communication From A Counterpart Application, Chinese Application 200910243107.8, Partial English Translation of Chinese Office Action dated Dec. 19, 2012, 3 pages.

* cited by examiner

METHOD FOR PROCESSING FORWARD ERROR CORRECTION, FEC, DATA, DEVICE AND SYSTEM THEREOF

CROSS-REFERENCE TO RELATED APPLICATIONS

This application is a continuation of International Application No. PCT/CN2010/080340, filed on Dec. 28, 2010, which claims priority to Chinese Patent Application No. 200910243107.8, filed on Dec. 28, 2009, both of which are hereby incorporated by reference in their entireties.

FIELD OF THE INVENTION

The embodiments of the present invention relate to the technical field of network communications, and particularly, to a method for processing Forward Error Correction, FEC, data, a device and a system thereof.

BACKGROUND OF THE INVENTION

In the interactive network media service system, the Content Delivery Network, CDN, and the terminal are connected to each other through the Internet Protocol, IP, network, and the media data is transmitted using the User Datagram Protocol, UDP, message. The UDP message may be randomly lost after passing several bearer network devices, which causes a picture damage or a voice pause at the terminal side.

The Forward Error Correction, FEC, technology performs an error correction encoding of the media data through the server side, adds the redundant information, and transmits them together. The terminal side performs a reverse FEC decoding and recovers the lost message.

In the existing in-band transmission FEC technology, a Payload Type, PT, field in the header of a Real-time Transport Protocol, RTP, message serves as an identification mark of the FEC data, and the FEC redundant information is encapsulated in the RTP message for a transmission.

During the implementation of the present invention, the inventor finds that the prior art at least has the following problem:

In the current in-band transmission FEC solution, if the receiving end does not support the FEC decoding function, it possibly causes an abnormal decoding at the receiving end side, thereby causing the picture or voice to be abnormal, and degrading the user's listening/watching experience.

SUMMARY OF THE INVENTION

The embodiments of the present invention provide a method for processing FEC data, a device and a system thereof, so as to prevent an abnormal decoding from possibly occurring at the receiving end.

The object of the present invention is achieved by the following technical solutions:

A Forward Error Correction, FEC, data transmission and processing method, comprising: encapsulating FEC data to be a Transport Stream, TS, message, setting FEC identification information in the TS message, and encapsulating the TS message to be a Real-time Transport Protocol, RTP, message; and sending the RTP message to a terminal side.

An FEC data reception and processing method, comprising: receiving the RTP message; when an FEC decoding function is locally available, identifying FEC data through FEC identification information in a TS message in the received RTP message, and recovering a lost media message according to the FEC data; and when the FEC decoding function is not available, removing a message header from the RTP message, identifying that data carried in the RTP message is not media data, and discarding the data.

An FEC data transmission and processing device, comprising: a TS message encapsulation module configured to encapsulate FEC data to generate a TS message, and set FEC identification information in the TS message; an RTP message encapsulation module configured to encapsulate the TS message generated by the TS message encapsulation module to generate an RTP message; and a message sending module configured to send the RTP message generated by the RTP message encapsulation module to the terminal side.

An FEC data reception and processing device, comprising: a message reception module configured to receive the RTP message; and a data processing module configured to identify FEC data according to FEC identification information in a TS message in the RTP message, and recover a lost media message according to the FEC data, when the reception processing device has an FEC decoding function; or remove a message header of the RTP message, identify that data carried in the RTP message is not media data, and discard the data, when the reception processing device has no FEC decoding function.

An FEC data processing system, comprising one FEC data transmission and processing device, and at least one FEC data reception and processing device, wherein the FEC data transmission and processing device and the FEC data reception and processing device communicate with each other through the Internet.

As can be seen from the technical solutions provided by the embodiments of the present invention, in the embodiments of the present invention, the TS encapsulation of the FEC data is performed and the FEC identification information is set in the TS message, and then the RTP encapsulation and transmission are carried out. Thus, when the reception end does not support the FEC decoding function, a decoding abnormity due to being impossible to identify FEC data will not appear, thereby improving the media service quality and the user's listening/watching experience.

BRIEF DESCRIPTION OF THE DRAWINGS

In order to more clearly describe the technical solutions of the embodiments of the present invention or the prior art, the drawings to be used in the descriptions of the embodiments or the prior art are briefly introduced as follows. Obviously, the following drawings just illustrate some embodiments of the present invention, and a person skilled in the art can obtain other drawings from these drawings without paying a creative effort.

DETAILED DESCRIPTION OF THE EMBODIMENTS

The technical solutions of the embodiments of the present invention will be clearly and completely described as follows in conjunction with the drawings. Obviously, the described embodiments are just a part of the embodiments of the present invention rather than all the embodiments. Based on the embodiments of the present invention, any other embodiment obtained by a person skilled in the art without paying a creative effort shall fall within the protection scope of the present invention.

Figure 1:
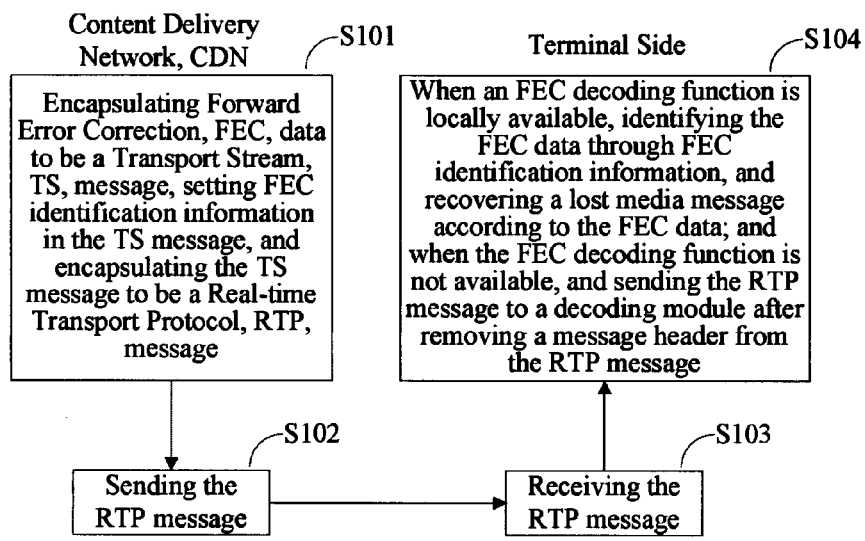
FIG. 1 is a schematic diagram of a processing procedure provided by an embodiment of the present invention.

In the interactive network media service system, the CDN and the terminal side are connected to each other through the IP network. The interactive network media service system refers to a system that transmits the media data using the UDP message, such as Internet Protocol Television, IPTV, system and Digital Television, DTV, system. The media data refers to video data, audio data, caption data and sign language data, etc. The embodiment of the present invention provides a method for processing FEC data in the interactive network media service system. As illustrated in FIG. 1, at the CDN side, the method provided by the embodiment of the present invention includes:

S101: encapsulating FEC data to be a Transport Stream, TS, message, setting FEC identification information in the TS message, and encapsulating the TS message to be a Real-time Transport Protocol, RTP, message;

S102: sending the RTP message to a terminal side.

At the terminal side, the method provided by the embodiment of the present invention includes:

S103: receiving the RTP message;

S104: when an FEC decoding function is available, identifying the FEC data according to the FEC identification information, and recovering a lost media message according to the FEC data; and when the FEC decoding function is not available, removing a message header from the RTP message, identifying that data carried in the RTP message is not media data, and discarding the data.

In which, the FEC data specifically includes redundant data acquired through an FEC encoding of the media data. The FEC identification information is configured to identify that the data carried in the TS message is the FEC data. The FEC identification information for example, but not limited to, may be set in the TS message by adding the FEC data type in the TS message having a message type of Program Map Table, PMT, and setting the data type as the FEC data type; or extending a Packet Identifier, PID, field of the TS message to add the FEC data type, and setting the PID field of the TS message as the FEC data type.

The above FEC data processing method provided by the embodiment of the present invention can be applied to either the out-of-band or the in-band transmitted FEC data processing technology, and preferably to the in-band transmission mode.

In the above embodiment of the present invention, S102 and S103 may specifically be performed by a media content source device, or an individual server in the CDN. S103 and S104 may specifically be performed by a set-top box at the terminal side, or the terminal. The terminal for example, but not limited to, refers to a device such as cell phone, personal computer, PDA, etc. The decoding process in S104 may specifically be operated by the set-top box or a decoding chip on the terminal.

In the above method provided by the embodiment of the present invention, the TS encapsulation of the FEC data is performed at the CDN side, the FEC identification information is set in the TS message, and then the RTP encapsulation and transmission are carried out. Thus, when the terminal does not support the FEC decoding function, a decoding abnormity due to being impossible to identify FEC data will not appear because the format of the FEC data is different from that of the media data, thereby improving the media service quality, the user's listening/watching experience and the compatibility of the in-band transmission.

The current FEC in-band transmission further has the following problem: since the FEC encoding parameter at the terminal side is acquired through a signaling interaction with the CDN, the terminal side is probably impossible to acquire the FEC encoding parameter in time, thereby rendering being impossible to decode the FEC data so as to recover the lost packet. Thus for the current FEC in-band transmission, there is a problem that the FEC encoding parameter has poor adaptivity. In order to solve this problem, at the CDN side of the embodiment of the present invention, the TS message carrying the FEC data further carries an FEC parameter which specifically includes: FEC Algorithm Type, FEC Redundancy Rate, FEC Packet Identifier, FEC PID, FEC Symbol Size, FEC Symbol Num, etc. The position of the above FEC parameter in the payload of the TS message may be in front of or behind the FEC data. In which, the FEC Algorithm Type indicates which FEC algorithm is used for encoding/decoding the media data; the FEC Redundancy Rate refers to the ratio of the redundant information to the media data not FEC-encoded; the FEC PID refers to the identification information of the FEC data; the FEC Symbol refers to the minimum processing unit in the FEC encoding, and the FEC Symbol Size refers to a size (in byte) of the minimum processing unit; the FEC Symbol Num refers to the number of the FEC Symbols FEC-encoded at one time; and the FEC Payload Type refers to the value of the Payload Type field of the RTP message carrying the FEC data. Correspondingly, after the terminal side receives the RTP message, if the terminal side has the FEC decoding function, the TS message in the RTP message is parsed, and it is determined according to the FEC identification information in the TS message that the TS message carries FEC data and FEC parameter, then the FEC data and the FEC parameter are acquired so as to recover the lost media message according to the FEC data and the FEC parameter. In the technical solution provided by the embodiment of the present invention, the FEC parameter may further include FEC Payload Type, which is set in the RTP message header that encapsulates the FEC data, so as to identify the FEC data. If the terminal side supports the FEC decoding function, the FEC data can be directly identified according to the FEC Payload Type in the RTP message.

Figure 2:
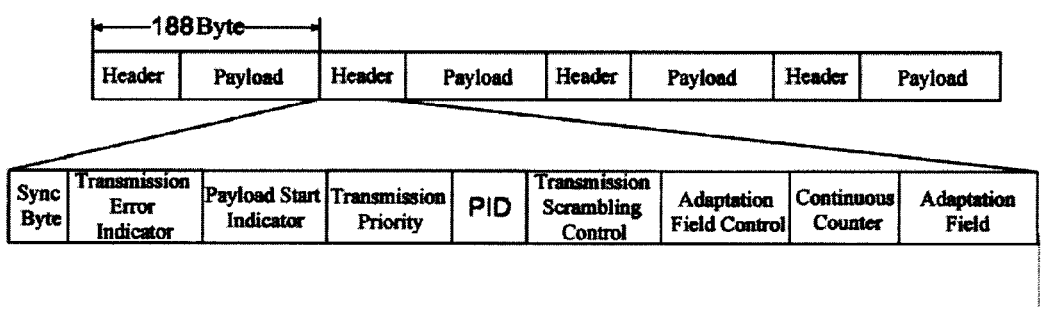
FIG. 2 is a schematic diagram of a TS message format in an embodiment of the present invention.

The length of the TS message is 188 bytes, and its message structure is illustrated in FIG. 2. In the embodiment of the present invention, the FEC data may be specifically encapsulated to be the TS message as follows: the FEC data to be encapsulated is distributed to several TS messages for an encapsulation, i.e., being encapsulated in a TS message stream, which also includes a TS message having a data type of Program Association Table, PAT, and a TS message having a message type of PMT.

The implementation of the embodiment of the present invention in actual application is detailedly described as follows.

Firstly, the structure of the TS message is briefly introduced. In the TS message format as illustrated in FIG. 2, the TS message has a length of 188 bytes, and it is divided into a header (i.e., message header) and a payload. In the embodiment of the present invention, the FEC data and the FEC parameter to be encapsulated are encapsulated as valid data of the TS message. The TS message header includes:

8-bit sync byte: valued as 0×47, and indicating the start of the TS message;

1-bit transmission error indicator: indicating through a set value that there is a non-corrective error in the transmission packet;

1-bit payload start indicator: the payload start mark of the Packetized Elementary Stream, PES, or the Program Special Information, PSI;

1-bit transmission priority: generally valued as 0;

13-bit PID: distinguishing the data type of the TS message;

2-bit transmission scrambling control: a value 00 means not to scramble;

2-bit adaptation field control: indicating whether an adaptation field or a payload is existed;

4-bit continuous counter: circularly increasing in progression from 0 to 16, and not counting when there is no payload; and variable byte adaptation field: controlling a flag bit according to the adaptation field, and determining whether the message header includes the adaptation field.

In which, when the PID is valued as 0, it means that the TS message is a PAT. In the PAT, the field "network/program mapping PID" is the PID of the PMT, and the PMT is used to define the data type, including audio data, video data, caption data, sign language data, etc. In the PMT, "N cycle" part is used to define the data type. In the embodiment of the present invention, the PMT is extended by adding the definition of the FEC data type to "N cycle" part of the PMT. The PID field of the TS message may also be extended by setting a special value to indicate the EC data type, so as to add the definition of the FEC data type.

Figure 3:
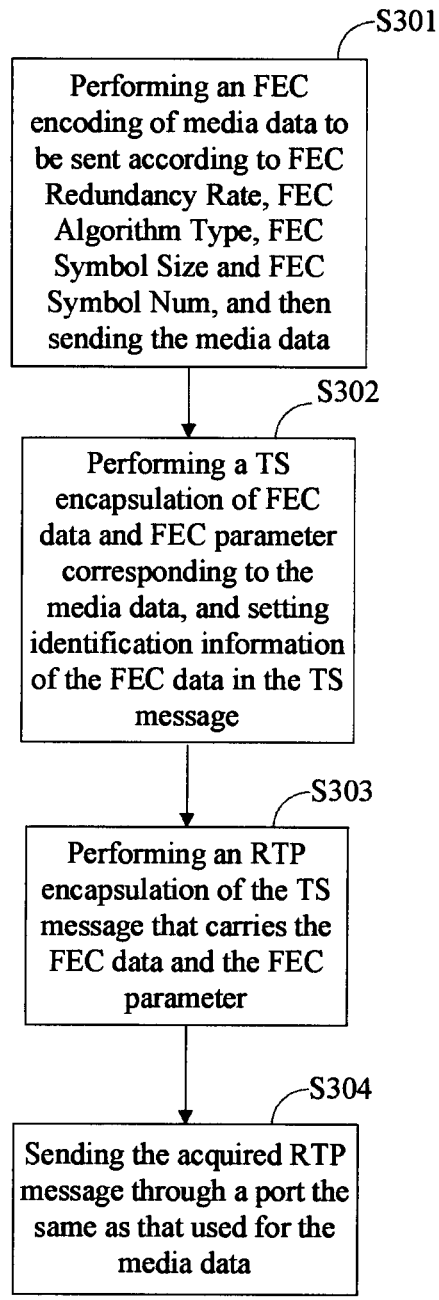
FIG. 3 is a schematic diagram of a processing procedure provided by an embodiment of the present invention.

One embodiment is given as follows to detailedly describe the implementation of an FEC data in-band transmission in a CDN, and as illustrated in FIG. 3, the process includes:

S301: performing an FEC encoding of media data to be sent according to FEC redundancy rate, FEC algorithm type, FEC Symbol Size and FEC Symbol Num, and then sending the media data;

S302: performing TS encapsulation of FEC data and FEC parameter corresponding to the media data: encapsulating the FEC data and the FEC parameter in a payload of a TS message, and setting identification information of the FEC data in the TS message, wherein the identification information may specifically be the FEC data type extended by "N cycle" part in the PMT, or the FEC data type extended in the PID field of the TS message;

S303: performing an RTP encapsulation of the TS message that carries the FEC data and the FEC parameter;

S304: sending the acquired RTP message through a port the same as that used for the media data.

In which, the FEC parameter is determined by the CDN side.

By extending the PID field in the TS message or extending the PMT, the FEC data type is added. In addition, the TS encapsulation of the FEC data is firstly performed, and then the RTP encapsulation and transmission are carried out, without identifying the FEC data at the PT field of the RTP message header.

In the embodiment of the present invention, the CDN side identifies the FEC data through the extended PMT or the PID field of the extended TS message, performs the TS encapsulation of the FEC data at first, and carries out the transmission after the RTP encapsulation. As compared with the FEC data is identified through the PT in the RTP message header in the prior art, the embodiment of the present invention avoids any decoding abnormality caused by the terminal side having no FEC decoding function.

Figure 4:
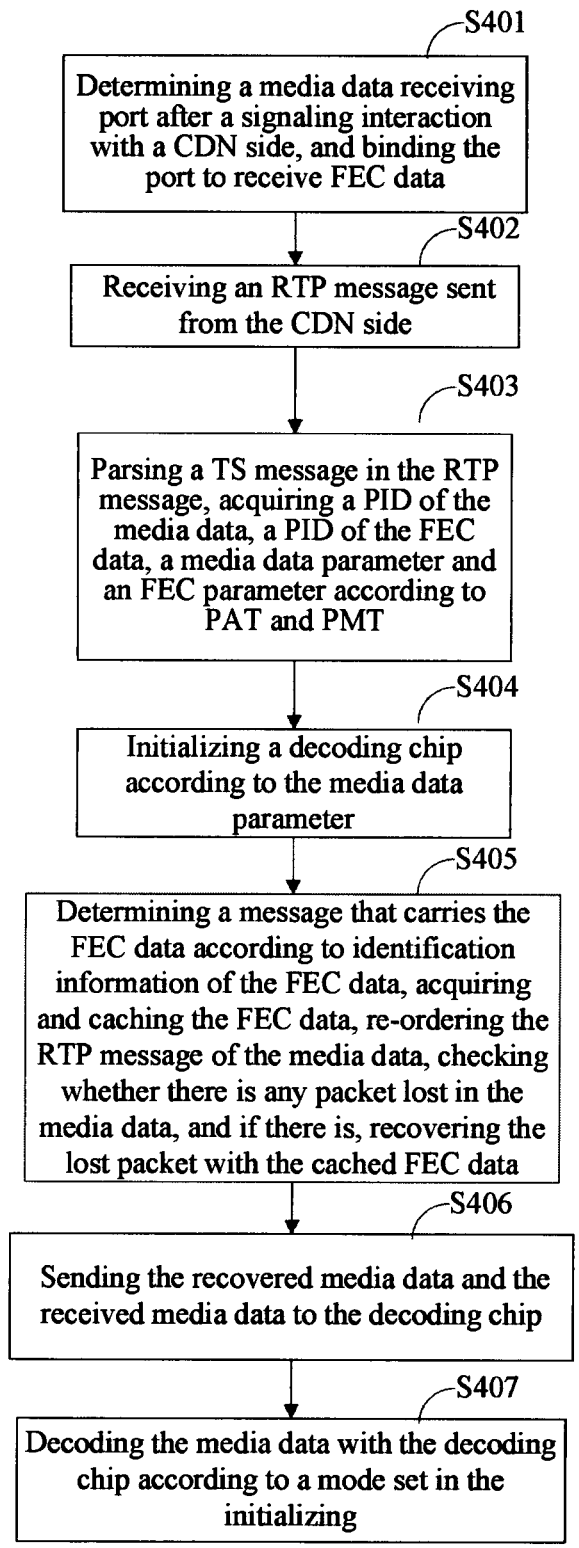
FIG. 4 is a schematic diagram of a processing procedure provided by another embodiment of the present invention.

The method for implementing a processing of the in-band transmitted FEC data by a terminal side having an FEC decoding function is detailedly described as follows through an embodiment. As illustrated in FIG. 4, the processing procedure includes:

S401: determining a media data receiving port after a signaling interaction with a CDN side, and binding the port to receive FEC data;

S402: receiving an RTP message sent from the CDN side, wherein the RTP message may be media data or FEC data, which is encapsulated in the RTP message after a TS encapsulation;

S403: parsing a TS message in the received RTP message, acquiring a PID of the media data, a PID of the FEC data, a media data parameter (e.g., media data encoding format, image size, etc.) and an FEC parameter (e.g., FEC Algorithm Type, FEC Redundancy Rate, FEC PID, FEC Symbol Size, FEC Symbol Num, etc.) according to PAT and PMT;

S404: initializing a decoding chip according to the media data parameter;

S405: determining a message that carries the FEC data according to identification information of the FEC data, acquiring and caching the FEC data, re-ordering the RTP message of the media data, checking whether there is any packet lost in the media data, and if there is, recovering the lost packet with the cached FEC data;

S406: sending the recovered media data and the received media data to the decoding chip;

S407: decoding the media data with the decoding chip according to a mode set in the initializing.

The above processing procedure is an embodiment in which the terminal side supporting the FEC decoding function processes the received RTP message.

Figure 5:
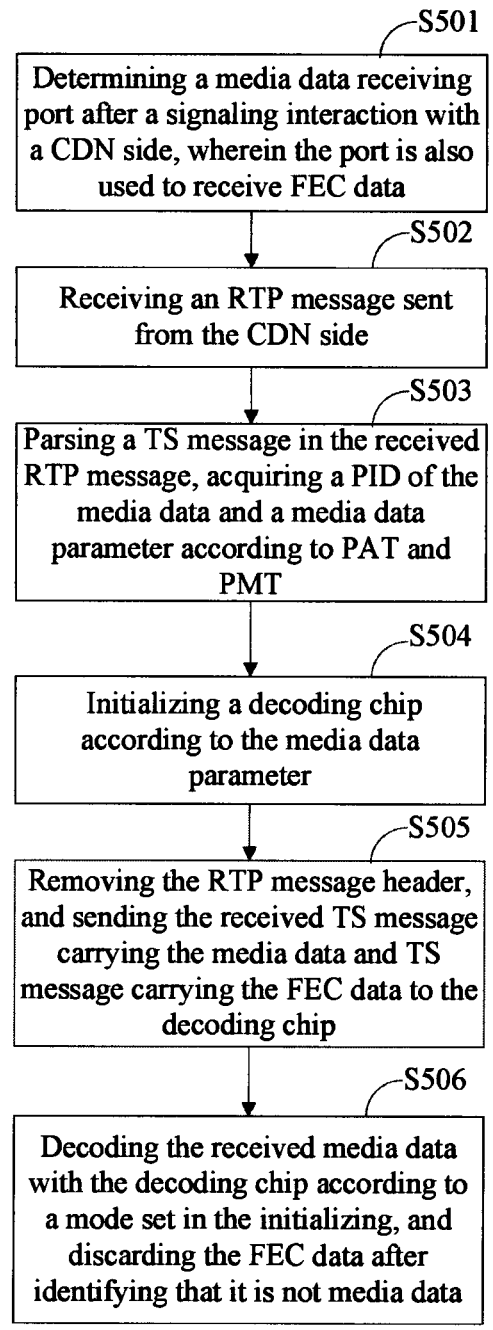
FIG. 5 is a schematic diagram of a processing procedure provided by still another embodiment of the present invention.

The method for implementing a processing of the in-band transmitted FEC data by a terminal side having no FEC decoding function is detailedly described as follows through another embodiment. As illustrated in FIG. 5, the processing procedure includes:

S501: determining a media data receiving port after a signaling interaction with a CDN side, wherein the port is also used to receive FEC data;

S502: receiving an RTP message sent from the CDN side, wherein the RTP message may be media data or FEC data, which is encapsulated in the RTP message after a TS encapsulation;

S503: parsing a TS message in the received RTP message, and acquiring a PID of the media data and a media data parameter (e.g., media data encoding format, image size, etc.) according to PAT and PMT;

S504: initializing a decoding chip according to the media data parameter;

S505: removing the RTP message header, and sending the received TS message carrying the media data and TS message carrying the FEC data to the decoding chip;

S506: decoding the received media data with the decoding chip according to a mode set in the initializing; since data type identification information of the TS message carrying the FEC data is different from that of the TS message carrying the media data, i.e., the encoding format of the FEC data is different from that of the media data, the decoding chip discards the FEC data after identifying that it is not the media data.

Figure 6:
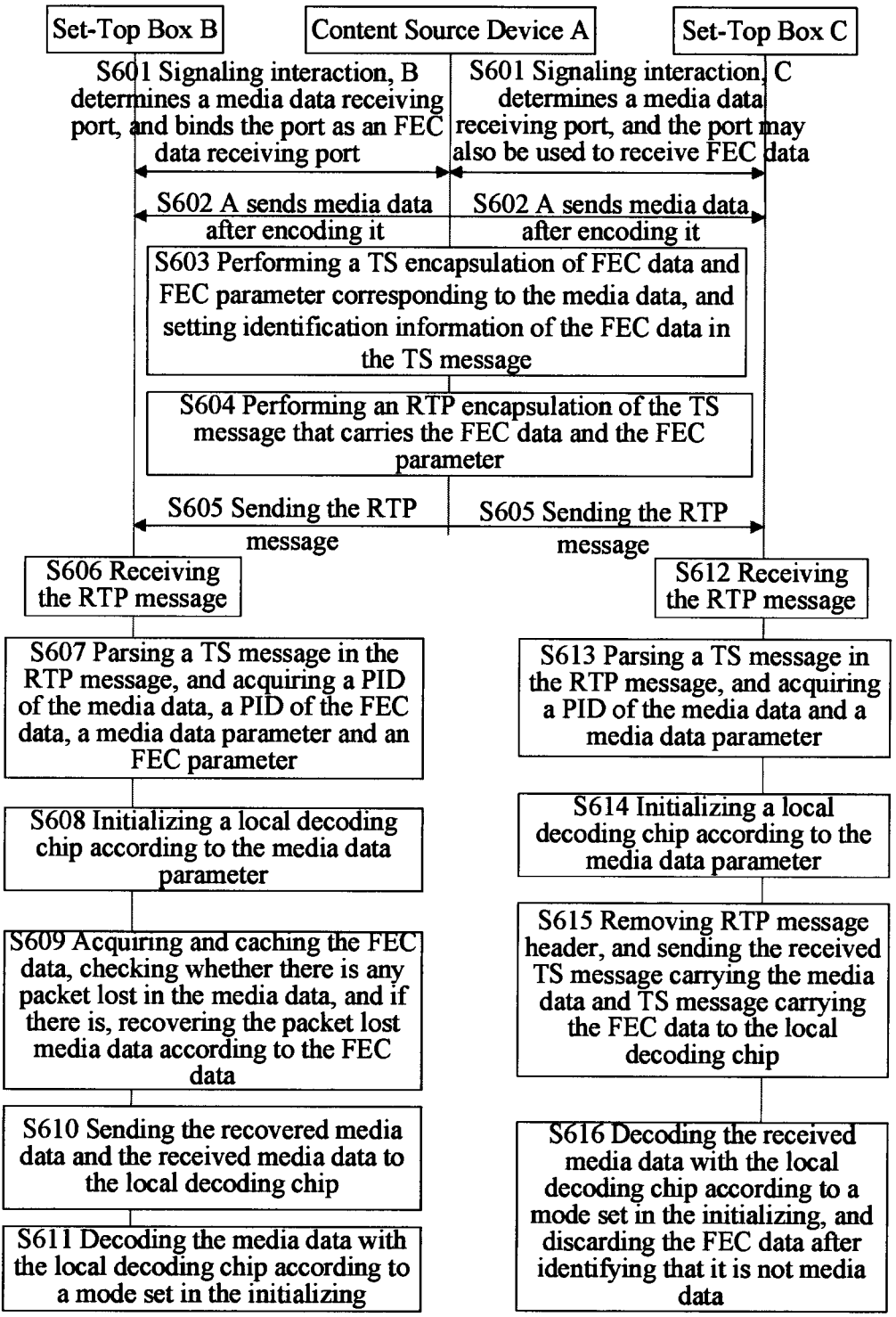
FIG. 6 is a schematic diagram of a processing procedure in a specific application embodiment.

The method provided by the embodiment of the present invention is detailedly described as follows through an example of implementing the in-band transmission of the FEC data in a specific application scene. In the specific application scene, a content source device A of an IPTV system sends media stream data to set-top boxes B and C at the terminal side, wherein the set-top box B supports the FEC decoding function while the set-top box C does not. The processing procedure is illustrated in FIG. 6, including:

S601: set-top boxes B and C perform a signaling interaction with a content source device A, respectively, to determine a media data receiving port, wherein the set-top box B binds the port to receive FEC data, and the set-top box C also receives FEC data through the port;

S602: the content source device A performs an FEC encoding of media data to be sent according to an FEC Redundancy Rate, an FEC Algorithm Type, an FEC Symbol Size and an FEC Symbol Num, and sending the media data to the set-top boxes B and C, respectively;

S603: the content source device A performs a TS encapsulation of FEC data and FEC parameter corresponding to the media data: encapsulating the FEC data and the FEC parameter in a payload of a TS message, and setting identification information of the FEC data in the TS message, wherein the identification information may be the FEC data type extended by "N cycle" part in the PMT, or the FEC data type extended in the PID field of the TS message;

S604: performing an RTP encapsulation of the TS message that carries the FEC data and the FEC parameter;

S605: sending the acquired RTP message to the set-top boxes B and C respectively, through a port the same as that used for the media data;

S606: the set-top box B receives the RTP message sent from the content source device A, wherein the RTP message may be the media data or the FEC data, which is encapsulated in the RTP message after the TS encapsulation;

S607: the set-top box B parses a TS message in the received RTP message, acquires a PID of the media data, a PID of the FEC data, a media data parameter (e.g., media data encoding format, image size, etc.) and an FEC parameter (e.g., FEC Algorithm Type, FEC Redundancy Rate, FEC PID, FEC Symbol Size, FEC Symbol Num, etc.) according to PAT and PMT;

S608: the set-top box B initializes a local decoding chip according to the media data parameter;

S609: the set-top box B determines a message that carries the FEC data according to the identification information of the FEC data, acquires and caches the FEC data, re-orders the RTP message of the media data, checks whether there is any packet lost in the media data, and if there is, recovers the lost packet with the cached FEC data;

S610: the set-top box B sends the recovered media data and the received media data to the local decoding chip;

S611: the local decoding chip of the set-top box B decodes the media data according to a mode set in the initializing;

S612: the set-top box C receives the RTP message sent from the content source device A, wherein the RTP message may be the media data or the FEC data, which is encapsulated in the RTP message after the TS encapsulation;

S613: the set-top box C parses a TS message in the received RTP message, acquires a PID of the media data and a media data parameter (e.g., media data encoding format, image size, etc.) according to PAT and PMT;

S614: the set-top box C initializes a local decoding chip according to the media data parameter;

S615: the set-top box C removes the RTP message header, and sends the received TS message carrying the media data and TS message carrying the FEC data to the local decoding chip;

S616: the local decoding chip of the set-top box C decodes the received media data according to a mode set in the initializing; since the data type identification information of the TS message carrying the FEC data is different from that of the TS message carrying the media data, i.e., the encoding format of the FEC data is different from that of the media data, the decoding chip discards the FEC data after identifying that it is not the media data.

The above processing procedure is the embodiment in which the terminal side not supporting the FEC decoding function processes the received RTP message. Since the encoding format of the FEC data is different from that of the media data, the decoding chip will not decode the FEC data as the media data, and avoid decoding abnormity.

For applying the method provided by the embodiment of the present invention during the processing procedure of the out-of-band transmitted FEC data, please refer to the above data processing procedures provided by various embodiments of the present invention. In the embodiment of the present invention, the in-band transmission and the out-of-band transmission only differ from each other in the data transmission port. During the out-of-band transmission, the RTP message carrying the FEC data and the RTP message carrying the media data use different IP ports to perform transmissions. With respect to the processing procedures of the FEC data by the CDN and the terminal side, please refer to the above processing procedures provided by various embodiments of the present invention.

All or a part of steps for implementing the above method embodiments may be completed by instructing relevant hardware through a program that may be stored in a computer readable storage medium, and when the program is executed, the steps of the above method embodiments are carried out. The storage medium includes various media that stores program codes, such as ROM, RAM, magnetic disk, optical disk, etc.

Figure 7:
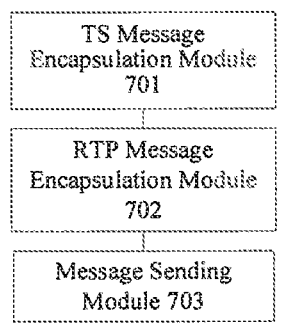
FIG. 7 is a structure diagram of an FEC data transmission and processing device provided by an embodiment of the present invention.

The embodiment of the present invention further provides an FEC data transmission and processing device, and its structure is illustrated in FIG. 7, including: a TS message encapsulation module 701 configured to encapsulate FEC data to generate a TS message, and set FEC identification information in the TS message; an RTP message encapsulation module 702 configured to encapsulate the TS message generated by the TS message encapsulation module 701 to generate an RTP message; and a message sending module 703 configured to send the RTP message generated by the RTP message encapsulation module 702 to the terminal side. In which, the FEC data specifically includes redundant data acquired through an FEC encoding of the media data. The FEC identification information is configured to identify that the data carried in the TS message is the FEC data. The FEC identification information for example, but not limited to, may be set in the TS message by adding the FEC data type in the PMT, and setting the data type as the FEC data type; or extending a PID field of the TS message to add the FEC data type, and setting the PID field of the TS message as the FEC data type.

At the CDN side, the FEC data transmission and processing device may specifically be a module in the content media source, or an individual server.

In which, the TS message encapsulation module 701 is further configured to encapsulate an FEC parameter in the TS message, wherein the FEC parameter includes FEC Algorithm Type, FEC Redundancy Rate, FEC PID, FEC Symbol Size and FEC Symbol Num. In the technical solution provided by the embodiment of the present invention, the FEC parameter may further include FEC Payload Type, which is set in an RTP message header encapsulating the FEC data to identify the FEC data. If the terminal side supports the FEC decoding function, it can directly identify the FEC data according to the FEC Payload Type in the RTP message.

In the above device provided by the embodiment of the present invention, when setting FEC identification information in the TS message, the TS message encapsulation module 701 is specifically configured to set FEC data type information in the TS message having a message type of PMT, or the PID field of the TS message.

Figure 8:
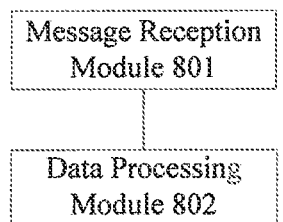
FIG. 8 is a structure diagram of an FEC data reception and processing device provided by an embodiment of the present invention.

The embodiment of the present invention further provides an FEC data reception and processing device, and its structure is illustrated in FIG. 8, including:

a message reception module 801 configured to receive an RTP message sent by the FEC data transmission and processing device; and a data processing module 802 configured to identify FEC data according to FEC identification information in a TS message in the RTP message, and recover a lost media message according to the FEC data, when the reception processing device has an FEC decoding function, or remove a message header of the RTP message, identify that data carried in the RTP message is not media data, and discard the data, when the reception processing device has no FEC decoding function.

At the terminal side, the FEC data reception and processing device specifically may be a set-top box or a terminal.

When the reception processing device has the FEC decoding function, the data processing module 802 in the device may be further configured to parse the TS message in the RTP message received by the message reception module 801, determine that the TS message carries an FEC parameter according to the FEC identification information in the TS message, and acquire the FEC parameter to recover the lost media message.

In the FEC data transmission and processing device provided by the embodiment of the present invention, the TS encapsulation of the FEC data is performed, the FEC identification information is set in the TS message, and then the RTP encapsulation and transmission are carried out. Thus, when the FEC data transmission and processing device does not support the FEC decoding function, a decoding abnormity due to being impossible to identify the FEC data will not appear because the format of the FEC data is different from that of the media data, thereby improving the media service quality, the user's listening/watching experience and the compatibility of the in-band transmission.

Figure 9:
FIG. 9 is a structure diagram of an FEC data processing system provided by an embodiment of the present invention.

The embodiment of the present invention further provides an FEC data processing system, and its structure is illustrated in FIG. 9, including: one FEC data transmission and processing device, and at least one FEC data reception and processing device. In which, the FEC data transmission and processing device and the FEC data reception and processing device communicate with each other through the Internet. For the implementations of the FEC data transmission and processing device and the FEC data reception and processing device, please refer to the above descriptions, and herein are omitted.

The above descriptions just illustrate the preferred embodiments of the present invention. To be noted, various improvements and modifications can be made by a person skilled in the art without deviating from the principle of the present invention, and shall be covered by the protection scope of the present invention.

What is claimed is:

1. A Forward Error Correction (FEC) data transmission and processing method, comprising:
    encapsulating FEC data to be a Transport Stream (TS) message;
    setting FEC identification information in the TS message;
    encapsulating the TS message to be a Real-time Transport Protocol (RTP) message;
    sending the RTP message to a terminal side;
    when an FEC decoding function is available at the terminal side, identifying the FEC data through the FEC identification in the TS message, and recovering a lost media message according to the FEC data; and
    when the FEC decoding function is not available at the terminal side, removing a message header from the RTP message, identifying that data carried in the RTP is not media data, and discarding the data.

2. The method according to claim 1, wherein the TS message further carries an FEC parameter that at least comprises: FEC Algorithm Type, FEC Redundancy Rate, FEC Packet Identifier (PID), FEC Symbol Size and FEC Symbol Number (Num).

3. The method according to claim 2, wherein setting the FEC identification information in the TS message comprises setting FEC data type information in the TS message having a message type of Program Map Table (PMT).

4. The method according to claim 2, wherein setting the FEC identification information in the TS message comprises setting FEC data type information in a PID field of the TS message.

5. The method according to claim 1, further comprising parsing the TS message to acquire a media data parameter, and initializing a decoding chip at the terminal side according to the media data parameter.

6. The method according to claim 1, wherein the FEC data and the media data comprise different formats.

7. The method according to claim 1, wherein the FEC data and the media data are transmitted in-band using a same port.

8. The method according to claim 1, wherein the FEC data and the media data are transmitted out-of-band using different ports.

9. A Forward Error Correction (FEC) data reception and processing method, comprising:
    receiving a Real-time Transport Protocol (RTP) message, wherein the RTP message is generated by encapsulating FEC data to be a Transport Stream (TS) message;
    setting FEC identification information in the TS message;
    encapsulating the TS message to be the RTP message;
    when an FEC decoding function is locally available, identifying the FEC data through the FEC identification information in the TS message in the received RTP message, and recovering a lost media message according to the FEC data; and
    when the FEC decoding function is not available, removing a message header from the RTP message, identifying that data carried in the RTP message is not media data, and discarding the data.

10. The method according to claim 9, wherein when the FEC decoding function is available, the method further comprises:
    parsing the TS message in the received RTP message;
    determining that the TS message carries an FEC parameter according to the FEC identification information in the TS message;

acquiring the FEC parameter; and
recovering the lost media message according to the FEC data and the FEC parameter.

11. The method according to claim 9, further comprising parsing the TS message to acquire a media data parameter, and initializing a decoding chip at a terminal side according to the media data parameter.

12. The method according to claim 9, wherein the FEC data and the media data comprise different formats.

13. The method according to claim 9, wherein the FEC data and the media data are transmitted in-band using a same port.

14. The method according to claim 9, wherein the FEC data and the media data are transmitted out-of-band using different ports.

15. A Forward Error Correction (FEC) data transmission and processing device, having a processor, wherein the FEC data transmission and processing device comprises:
 a Transport Stream (TS) message encapsulation module configured to encapsulate FEC data to generate a TS message, and set FEC identification information in the TS message;
 a Real-time Transport Protocol (RTP) message encapsulation module configured to encapsulate the TS message generated by the TS message encapsulation module to generate an RTP message; and
 a message sending module configured to send the RTP message generated by the RTP message encapsulation module to a terminal side,
 wherein when an FEC decoding function is available at the terminal side, the FEC data is identified through the FEC identification information in the TS message in the RTP message, and a lost media message is recovered according to the FEC data, and
 wherein when the FEC decoding function is not available at the terminal side, a message header is removed from the RTP message, data carried in the RTP message is identified as not being media data, and the data is discarded.

16. The device according to claim 15, wherein the TS message encapsulation module is further configured to encapsulate an FEC parameter in the TS message, wherein the FEC parameter at least comprises FEC Algorithm Type, FEC Redundancy Rate, FEC Packet Identifier (PID), FEC Symbol Size and FEC Symbol Number (Num).

17. The device according to claim 15, wherein when setting the FEC identification information in the TS message, the TS message encapsulation module is specifically configured to set FEC data type information in the TS message having a message type of Program Map Table (PMT).

18. The device according to claim 15, wherein when setting the FEC identification information in the TS message, the TS message encapsulation module is specifically configured to set FEC data type information in a Packet Identifier (PID) field of the TS message.

19. The device according to claim 15, wherein the terminal side is configured to parse the TS message to acquire a media data parameter and initialize a decoding chip at the terminal side according to the media data parameter.

20. The device according to claim 15, wherein the FEC data and the media data comprise different formats.

* * * * *